(12) United States Patent
Deleonibus et al.

(10) Patent No.: US 8,389,368 B2
(45) Date of Patent: Mar. 5, 2013

(54) METHOD FOR PRODUCING A CONDUCTIVE NANOPARTICLE MEMORY DEVICE

(75) Inventors: Simon Deleonibus, Claix (FR); Jean-Marie Basset, Caluire-et-Cuire (FR); Paul Campbell, Lyon (FR); Thibaut Gutel, Cepoy (FR); Paul-Henri Haumesser, Saint Cassien (FR); Gilles Marchand, Pierre-Chatel (FR); Catherine Santini, Collonges Au Mont d'Or (FR)

(73) Assignees: Commissariat à l'énergie atomique et aux energies alternatives, Paris (FR); Centre National de la Recherche Scientifique, Paris (FR)

( * ) Notice: Subject to any disclaimer, the term of this patent is extended or adjusted under 35 U.S.C. 154(b) by 24 days.

(21) Appl. No.: 12/727,593

(22) Filed: Mar. 19, 2010

(65) Prior Publication Data

US 2011/0033996 A1 Feb. 10, 2011

(30) Foreign Application Priority Data

Mar. 27, 2009 (FR) ...................................... 09 01463

(51) Int. Cl.
*H01L 21/336* (2006.01)
(52) U.S. Cl. ........ 438/287; 438/199; 438/305; 438/149; 438/151; 438/22; 365/129; 257/314; 257/316; 257/325; 427/58
(58) Field of Classification Search ........................ None
See application file for complete search history.

(56) References Cited

U.S. PATENT DOCUMENTS
(Continued)

FOREIGN PATENT DOCUMENTS

| FR | 2 757 312 A1 | 6/1998 |
| FR | 2 772 989 A1 | 6/1999 |

(Continued)

OTHER PUBLICATIONS

T. Welton, "Ionic Liquids: A New Class of Solvents", Chapter 5.2.1.2 of Multiphase Homogeneous Catalysis, Wiley: Weinheim, 2005, vol. 2, pp. 431-454.*

(Continued)

*Primary Examiner* — Julio J Maldonado
*Assistant Examiner* — Shantanu C Pathak
(74) *Attorney, Agent, or Firm* — Oblon, Spivak, McClelland, Maier & Neustadt, L.L.P.

(57) ABSTRACT

A method for producing a memory device with nanoparticles, including steps of: a) forming, in a substrate based on at least one semi-conductor, source and drain regions, and at least one first dielectric on at least one zone of the substrate arranged between the source and drain regions and intended to form a channel of the memory device, b) depositing of at least one ionic liquid that is an organic salt or mixture of organic salts in a liquid state, wherein nanoparticles of at least one electrically conductive material are suspended in the ionic liquid, said ionic liquid covering at least said first dielectric, c) forming a deposition of said nanoparticles at least on said first dielectric, d) removing the ionic liquid remaining on the first dielectric, and e) forming at least one second dielectric and at least one control gate on at least one part of the nanoparticles deposited on the first dielectric.

11 Claims, 7 Drawing Sheets

U.S. PATENT DOCUMENTS

| | | | |
|---|---|---|---|
| 6,346,450 | B1 | 2/2002 | Deleonibus et al. |
| 7,161,206 | B2 | 1/2007 | Oh et al. |
| 2004/0029345 | A1* | 2/2004 | Deleonibus et al. ......... 438/257 |
| 2006/0008973 | A1* | 1/2006 | Phua et al. .................... 438/231 |
| 2007/0063263 | A1 | 3/2007 | Oh et al. |
| 2007/0064468 | A1* | 3/2007 | Seol et al. ...................... 365/129 |
| 2007/0190675 | A1* | 8/2007 | Yamazaki et al. .............. 438/22 |
| 2009/0074950 | A1 | 3/2009 | Sinha |

FOREIGN PATENT DOCUMENTS

| | | |
|---|---|---|
| FR | 2 810 161 A1 | 12/2001 |
| WO | WO 98/03977 | 1/1998 |

OTHER PUBLICATIONS

Kurinec et al., "Cathodic Electrophoresis of Ceramic Nano-particle Mnx-Zny Fe2O4", 207th ECS Meeting, Abstract #368, 2005, 1 page.*

Gutel et al. ("Influence of the self-organization of ionic liquids on the size of ruthenium nanoparticles: effect of the temperature and stirring", J. Mater. Chem., 2007, 17, 3290-3292).*

Hussein I. Hanafi, et al., "Fast and Long Retention-Time Nano-Crystal Memory", IEEE Transactions on Electron Devices, vol. 43, No. 9, Sep. 1996, pp. 1553-1558.

Luca Perniola, et al., "Modeling of the Programming Window Distribution in Multinanocrystals Memories", IEEE Transactions on Nanotechnology, vol. 2, No. 4, Dec. 2003, pp. 277-284.

Didier Astruc, et al., "Nanoparticles as Recyclable Catalysts: The Frontier Between Homogeneous and Heterogeneous Catalysis", Angew. Chem. Int. Ed., 44, 2005, pp. 7852-7872.

Jan De Blauwe, "Nanocrystal Nonvolatile Memory Devices", IEEE Transactions on Nanotechnology, vol. 1, No. 1, Mar. 2002, pp. 72-77.

V. Carreau, et al., "Evolution of Cu Microstructure and Resistivity during Thermal Treatment of Damascene Line: Influence of Line Width and Temperature", Microelectronic Engineering, 84, 2007, pp. 2723-2728.

J. C. Coiffic, et al., "Conduction Regime in Innovative Carbon Nanotube via Interconnect Architectures", Applied Physics Letters, 91, 252107, 2007, pp. 252107-1 to 252107-3.

M. Dubose, et al., "Impact of the Cu-Based Substrates and Catalyst Deposition Techniques on Carbon Nanotube Growth at Low Temperature by PECVD", Microelectronic Engineering, 84, 2007, pp. 2501-2505.

Thibaut Gutel, et al., "Influence of the Self-Organization of Ionic Liquids on the Size of Ruthenium Nanoparticles: Effect of the Temperature and Stirring", J. Mater. Chem., 2007, 17, pp. 3290-3292.

Hidekazu Nishino, et al., "Water-Assisted Highly Efficient Synthesis of Single-Walled Carbon Nanotubes Forests from Colloidal Nanoparticle Catalysts", J. Phys. Chem. C, 111, 2007, pp. 17961-17965.

A. Kukovecz, et al., "Catalytic Synthesis of Carbon Nanotubes Over Co, Fe and Ni Containing Conventional and Sol-Gel Silica-Aluminas", Phys. Chem. Chem. Phys., 2, 2000, pp. 3071-3076.

Dr. Santosh Kurinec, et al., "Cathodic Electrophoresis of Ceramic Nano-particle $Mn_x$-$Zn_y$ $Fe_2$ $O_4$", $207^{th}$ ECS Meeting, Abstract #368, 2005, 1 page.

Thomas Welton, "Room-Temperature Ionic Liquids. Solvents for Synthesis and Catalysis", Chem. Rev., 99, 1999, pp. 2071-2083.

Helmut Bönnemann et al., "Colloidal Nanoparticles in Catalysis", Chapter 3 of Surface and Nanomolecular Catalysis, CRC Press, Boca Raton, 2006, pp. 63-93.

Helmut Bönnemann et al., "Metal Nanoclusters: Synthesis and Strategies for their Size Control", Chapter 2 of Metal Nanoclusters in Catalysis and Materials Science: The Issue of Size Control, Elsevier B.V: Amsterdam, 2008, pp. 21-48.

John S. Bradley et al., "Nobel Metal Nanoparticles", Chapter 3.2.1 of Nanoparticles—from theory to application, Wiley-VCH, Weinheim, 2004, pp. 186-199.

Tom Welton, "Ionic Liquids: A New Class of Solvents", Chapter 5.2.1.2 of Multiphase Homogeneous Catalysis, Wiley: Weinheim, 2005, vol. 2, pp. 431-454.

Jairton Dupont et al., "On the Structural and Surface Properties of Transition-Metal Nanoparticles in Ionic Liquids", Chemical Society Reviews, vol. 39, 2010, pp. 1780-1804.

Bruno Chaudret, "Synthesis and Surface Reactivity of Organometallic Nanoparticles", Topics in Organometallic Chemistry, vol. 16, 2005, pp. 233-259.

* cited by examiner

METHOD FOR PRODUCING A CONDUCTIVE NANOPARTICLE MEMORY DEVICE

TECHNICAL FIELD

This document relates to the field of electronic memories and the production of such memories. More specifically, it relates to the production of an electronic or microelectronic memorisation device, or memory device, of non-volatile type, in other words which conserves data in the absence of electrical supply, with electrically conductive nanoparticles, for example of Flash type.

STATE OF THE PRIOR ART

It is generally sought to produce memories or memory circuits with ever increasing information storage capacities and reading and writings speeds. These objectives entail miniaturising the electronic components forming these memories and increasing the integration densities of these components.

A conventional floating gate memory device, in other words an individual electronic memorisation component, has a structure similar to that of a field effect transistor, in other words it comprises a source, a channel and a drain. Nevertheless, compared to a field effect transistor that only comprises a single control gate arranged above the channel, the memory device comprises a gates structure comprising a floating gate and a control gate, these two gates being electrically insulated from each other by an inter-gate layer based on a dielectric material and arranged between said two gates. The state in which the floating gate is (as a function of the number of electrons stored in the floating gate) represents the value of the bit memorised by the memory device.

Such a floating gate memory device has several drawbacks when it is sought to miniaturise it. Indeed, the reduction in the dimensions of this device necessarily entails reducing the thickness of the dielectric that insulates the floating gate from the substrate. This reduction in thickness of said dielectric leads to problems of retention of information by the memory device because the electrons stored in the floating gate can exit it much more easily by tunnel effect. In addition, this reduction in the thickness of the dielectric reveals defects in said dielectric, said defects favouring the leakage of electrons as the information writing cycles are carried out in the memory device. Just one of these defects may for example completely empty the floating gate of the electrons that are stored therein.

In order to resolve the problems linked to the miniaturisation of floating gate memory devices, and thereby produce memory devices for example compatible with sub-65 nm technology nodes, other architectures of memory devices thus need to be envisaged.

It is for example known to produce memory devices in which the floating gate is replaced by semi-conductor nanocrystals. These nanocrystals form discrete electron storage elements. The document "Fast and long retention-time nanocrystal memory" of Hanafi, H. I. et al., IEEE Transactions on Electron Devices, vol. 43, n°9, September 1996, pages 1553 to 1558, describes the production of memory devices comprising silicon or germanium nanocrystals arranged in a layer of control oxide formed between the channel and the control gate, the nanocrystals being electrically insulated from the substrate by a tunnel oxide. The nanocrystals are formed of an implantation of silicon or germanium in the control oxide then an annealing at a temperature equal to around 950° C. Such a production method nevertheless has the major drawbacks of:

requiring a high thermal budget, incompatible with the other steps of producing the device when it is wished to produce the memory device by a standard CMOS method, being inefficient as to the precipitation of implanted atoms into nanocrystals.

The document "Modeling of the programming window distribution in multinanocrystals memories" of L. Perniola et al., IEEE Transactions on Nanotechnology, vol. 2, n°4, December 2003, pages 277 to 284, describes a method for producing nanocrystal memory devices wherein the nanocrystals are deposited by LP-CVD (low pressure chemical vapour deposition). Unlike the production of nanocrystals by implantation and annealing, the formation of nanocrystals by LP-CVD makes it possible to avoid the implementation of an annealing step at high temperature.

Nevertheless, in producing the nanocrystals by LP-CVD or by implantation and annealing, the nanocrystals obtained have a relatively high size dispersion. In addition, these techniques do not enable densities of nanocrystals greater than around $10^{12}$ cm$^{-2}$ to be obtained.

DESCRIPTION OF THE INVENTION

Thus there is a need to propose a method for producing a memory device not having the drawbacks of the prior art, which is compatible with the steps of a CMOS method, in other words not requiring a high thermal budget, and which makes it possible to obtain a better control of the size of the electron storage sites, as well as a higher density of electron storage sites in the memory device.

To do this, one embodiment proposes a method for producing a nanoparticle memory device, comprising at least the steps of:

a) forming, in a substrate based on at least one semi-conductor, source and drain regions, and at least one first dielectric on at least one zone of the substrate arranged between the source and drain regions and intended to form a channel of the memory device, b) deposition of at least one ionic liquid, comprising nanoparticles of at least one electrically conductive material in suspension, covering at least said first dielectric, c) formation of a deposition of said nanoparticles at least on said first dielectric, d) removal of the remaining ionic liquid, e) forming at least one second dielectric and at least one control gate on at least one part of the deposition of nanoparticles.

Ionic liquid is taken to mean an organic salt or a mixture of organic salts, the melting point of which is less than or equal to around 100° C., forming associations of organic cations and organic or inorganic anions.

The use of an ionic liquid in this method for forming the deposition of nanoparticles has several advantages.

Indeed, an ionic liquid has a low volatility and very low vapour pressure, unlike volatile organic solvents or aqueous solvents. Ionic liquids are thus easier to handle in small volumes, without risk of evaporation, at much higher temperatures, and if necessary at much lower pressures, than volatile organic solvents. Ionic liquids also have high thermal stability, for example up to temperatures greater than around 400° C., and a high chemical stability, which is an advantage particularly from a safety point of view while implementing industrial methods compared to organic solvents.

In addition, ionic liquids may be used in electrochemistry on account of their ionic conductivity and their wide electrochemical window. Their physical properties may also be modulated as a function of the type of anions and cations of which it is composed. Their wide electrochemical window also enables the synthesis of a large range of metals, in particular those not accessible for example in electrochemistry in aqueous medium.

This method also makes it possible to obtain a very good control of the size of the nanoparticles in the memory device and thus to well control the size distribution of these nanoparticles because the synthesis of nanoparticles in the ionic liquid, carried out before the method for producing the memory device, offers a very good control of the nominal size of the nanoparticles formed in the ionic liquid. This method thus makes it possible to obtain a deposition of mono-dispersed nanoparticles, in other words all comprising a substantially similar size to the nearest one or two atoms (a nanoparticle being able to comprise for example around 100 atoms). This makes it possible to obtain nanoparticles in which the electrical properties, for example the conduction, are uniform over all the nanoparticles deposited.

The use of an ionic liquid for forming the deposition of nanoparticles moreover offers wetting properties that are favourable to their penetration in submicron etched structures as well as very good rheological properties favouring the control of the spreading of the ionic liquid, for example during a deposition of said ionic liquid by spin coating or by spraying or sputtering.

This method makes it possible to obtain a memory device comprising a deposition of nanoparticles not touching each other, each nanoparticle forming an electron storage zone independent of the other electron storage zones formed of the other nanoparticles. Thus, the overall information retention of the memory device is improved because the presence of defects in the insulators surrounding the nanoparticles does not affect the retention of electrons by the other nanoparticles.

The formation of source and drain regions during step a) may be obtained by the implementation of the following steps:

a1) forming at least one dummy gate on the substrate, at the level of said zone intended to form the channel of the memory device, a2) implantation of dopants in the substrate using the dummy gate as implantation mask, the doped zones of the substrate obtained forming the source and drain regions, the dummy gate then being removed before the implementation of step b).

It is thus possible to form a deposition of nanoparticles and a control gate auto-aligned in relation to the source and drain regions.

The method may further comprise, between step a2) and the step of removal of the dummy gate, the following steps:

forming spacers based on at least one dielectric material against the lateral flanks of the dummy gate, depositing at least one coating layer on the dummy gate, the spacers and the source and drain regions, planarisation of the coating layer with stoppage on the dummy gate.

The method may further comprise, between the step of removal of the dummy gate and the step b) of depositing the ionic liquid, or between the step of removal of the dummy gate and the formation of the first dielectric, a step of etching at least one part of the spacers in contact with the substrate, forming hollows underneath a remaining part of the spacers, the ionic liquid also being deposited, during step b), in said hollows, and the nanoparticles also being deposited, during step c), at the level of zones of the substrate situated in said hollows. The nanoparticles may be separated from the substrate by a tunnel insulator, the first dielectric also being formed in said hollows.

Thus, it is possible to form the deposition of nanoparticles up to underneath any hollows or spaces formed underneath the lateral spacers, which can thus cover a part of the source and drain zones in the vicinity of the junction between these regions and the channel.

The method may further comprise, between the step of forming spacers and the step of depositing the coating layer, a step of silicidation of at least one part of the source and drain regions. The term "silicidation" corresponds, here and throughout the remainder of the document, to the formation of a compound based on semi-conductor and metal and is not limited to the formation alone of silicide, in other words a compound of silicon and metal. The term "silicidation" will be employed even when the substrate is based on a semi-conductor other than silicon.

Step c) of formation of the deposition of nanoparticles may comprise at least one step of incubation of the substrate and the ionic liquid for a time lasting between around five minutes and one hour, or between around one minute and one hour, or greater than or equal to around one minute.

A non-zero difference in electric potentials may be applied between the substrate and the ionic liquid during at least one part of step c) of formation of the deposition of nanoparticles.

In a particular embodiment, the difference in electric potentials may be applied, for example via the substrate, between the source and/or drain region and the ionic liquid. Thus, the density of nanoparticles deposited in the vicinity of the source and/or drain regions may be greater than the density of deposition of nanoparticles obtained on the other zones. This particular configuration of the deposition of nanoparticles in the memory device makes it possible in particular to produce a memory device with several memorisation levels, in other words comprising several electron trapping energy levels, which makes it possible to memorise information on several bits in a single memory device. This configuration makes it possible in particular:

to be able to inject charges from the drain (or source) electrode to the nanoparticles in a much more reliable manner than in the methods of the prior art, to double the memorisation capacity compared to the multilevel memory devices of the prior art thanks to its information writing capacity on either side of the channel, in other words in the nanoparticles located either on the source side, or the drain side.

Step d) of removal of the ionic liquid may comprise a step of rinsing by a solvent and a step of drying, or a step of degradation by a heat treatment at a temperature between around 200° C. and 500° C. Carrying out a heat treatment to eliminate the excess of ionic liquid makes it possible in particular to maximise the density of the deposited nanoparticles. In the case of an elimination of the remaining ionic liquid by a degradation by heat treatment, this degradation may be assisted by an energy source, for example a source of ultraviolet rays, illuminating the ionic liquid during the thermal degradation.

Step e) of forming the second dielectric and the control gate may be obtained by the implementation of the following steps:

e1) deposition of a layer based on a dielectric material at least on the deposition of nanoparticles, e2) deposition of a layer based on an electrically conductive material on the layer based on dielectric material, e3) planarisation of at least said layer based on electrically conductive material and said layer based on dielectric material.

Preferably, the ionic liquid may comprise at least one cation of alkyl substituent bearing imidazolium type. Such an ionic liquid makes it possible in particular to improve the repetitiveness concerning the control of the size of the nanoparticles, the size of an alkyl substituent corresponding to a size of a nanoparticle in the ionic liquid.

The ionic liquid may be chosen among $BMIMNTf_2$, $HMIMNTf_2$ or $OMIMNTf_2$, and/or the nanoparticles in suspension in the ionic liquid may be based on ruthenium, or any other electrically conductive material suited to forming the deposition of nanoparticles.

BRIEF DESCRIPTION OF DRAWINGS

The present invention will be better understood on reading the description of embodiments given purely by way of indication and in no way limiting and by referring to the appended drawings, in which.

Figure 1:
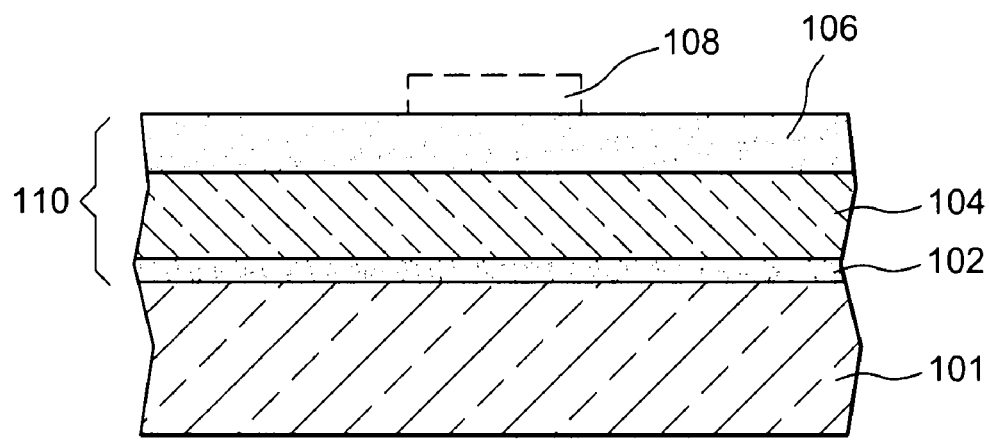
FIGS. 1 to 9 represent the steps of a method for producing a nanoparticle memory device according to a first embodiment.

Identical, similar or equivalent parts of the different figures described hereafter bear the same numerical references so as to make it easier to go from one figure to the next.

In order to make the figures easier to read, the different parts represented in the figures are not necessarily to the same scale.

The different possibilities (alternatives and embodiments) must be understood as not being mutually exclusive and may be combined together.

DETAILED DESCRIPTION OF SPECIFIC EMBODIMENTS

Reference will be made to FIGS. 1 to 9, which represent the steps of a method for producing a nanoparticle memory device 100 according to a first embodiment.

The memory device 100 is here formed from a substrate 101 based on semi-conductor, for example silicon, one face of which has been oxidised beforehand in order to form a dielectric layer 102 for example based on silicon oxide. A layer 104, for example based on polycrystalline or amorphous silicon, is then deposited on the layer of oxide 102, then a layer of silicon nitride 106 is deposited on the silicon layer 104. In an alternative, the layer 104 could be based on silicon nitride and the layer 106 based on polycrystalline or amorphous silicon. The layers 102, 104 and 106 together form a stack 110, the thickness of which is for example between around 100 nm and 500 nm and corresponds substantially to the thickness of the structure composed of a deposition of nanoparticles and a control gate of the memory device 100 obtained at the end of the method.

In an alternative of this first embodiment, the memory device 100 could be formed directly from an SOI, or semi-conductor on insulator, type substrate.

An etching mask 108, represented by a dashed line in FIG. 1, is formed on the layer 106 of silicon nitride for example by deposition of a layer of photosensitive resin and etching of said layer. The mask 108 is arranged at the level of the position of a dummy gate that it is wished to form in the stack 110. In addition, the size and the shape of the mask 108 correspond to the size and the shape of this dummy gate.

The layers 102, 104 and 106 are etched so that only the portions of these layers located underneath the mask 108 remain after the etching. The remaining portions of the layers 102, 104 and 106, in other words of the stack 110, form the body of the dummy gate designated by reference 112 in FIG. 2.

Then a first ion implantation at low dose is carried out in the substrate 101, at the level of regions 118 and 120 intended to form the source and drain regions of the memory device 100. The implanted doping elements are for example ions of boron, phosphorous or even arsenic, chosen as a function of the type of conductivity (N or P) of the substrate 101. This implantation is for example carried out at a dose between around $10^{13}$ and $10^{15}$ at/cm$^2$, with an energy between around 3 and 25 keV.

Figure 2:
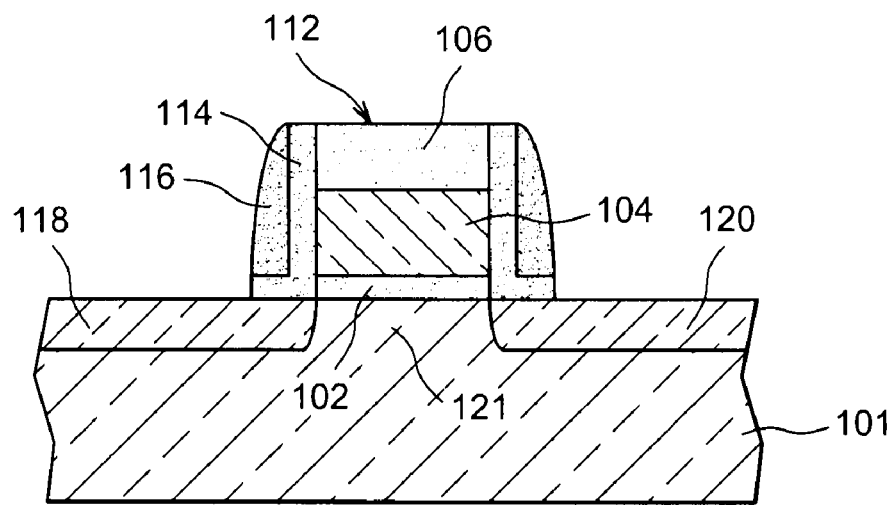

This first ion implantation is followed by the formation, against the lateral flank(s) of the dummy gate 112, of lateral spacers 114, 116 represented in FIG. 2. Each of these spacers comprises a first portion of silicon oxide 114 arranged against the lateral flanks of the layers 102, 104 and 106 of the dummy gate 112, making it possible to limit the contact stresses with the dummy gate 112, and particularly with the silicon of the layer 104. This first portion of silicon oxide 114 also makes it possible to limit the contact stresses with the portion of the substrate 101 with which it is in contact. A second portion 116, for example based on silicon nitride, covers each portion of silicon oxide 114, and makes it possible to protect the dummy gate 112 from subsequent treatments of the method and in particular the silicidation treatment of the source and drain regions 118, 120. These lateral spacers 114, 116 may be obtained after the implementation of full wafer depositions of silicon oxide and silicon nitride, then an anisotropic etching of these materials so as to only leave remaining portions of these layers on the lateral flanks of the dummy gate 112.

After the formation of the lateral spacers 114, 116, a second ion implantation is then carried out, at doses greater than those of the first ion implantation, for example between around $10^{14}$ and $5.10^{15}$ at/cm$^2$. This second implantation then uses the dummy gate and the lateral spacers as implantation mask. In this case, the regions 118 and 120 form source and drain regions doped gradually, in other words in which the doping decreases in going towards a channel 121 formed of the zone of the substrate 101 located underneath the dummy gate 112, between the source and drain regions 118, 120. Source and drain regions 118, 120 are thus obtained in part based on semi-conductor degenerated at the level of zones having undergone this second ion implantation.

Figure 3:
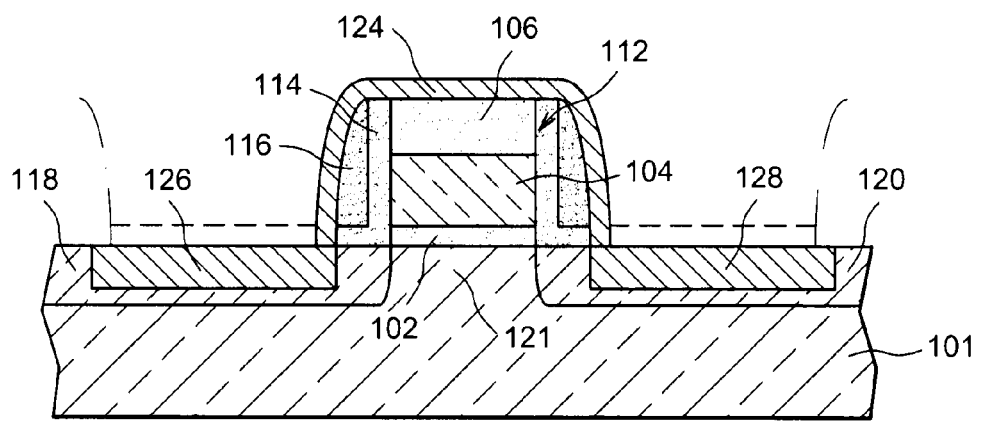

As represented in FIG. 3, a selective silicidation of the substrate 101 at the level of the source and drain regions 118, 120 is then carried out. This silicidation is carried out by depositing firstly a layer 124 based on a metal such as titanium, cobalt or instead nickel, then by carrying out a heat treatment at a sufficient temperature to give rise to a silicidation reaction between the silicon of the substrate 101 and the metal of the layer 124, this temperature being for example between around 150° C. and 800° C. This silicidation makes it possible in particular to increase locally the conductivity of the source and drain regions, and thus to reduce their access resistance.

The silicidation is here described as selective in so far as it is limited to the zones in which the metal of the layer 124 is directly in contact with silicon. It may be observed in FIG. 3 that the layer of metal 124 has disappeared above the source and drain regions 118, 120 to form there superficial layers 126, 128 of silicide in the source and drain regions, in the substrate 101. A remaining portion of the layer of metal 124 is nevertheless present on the lateral spacers 114, 116 and on the dummy gate 112 after the implementation of the heat treatment, this remaining metal portion not having reacted with the materials with which it is in contact. In FIG. 3, the short and long dashes at the ends of FIG. 3 represent other dummy gates that may be formed on the substrate 101.

Figure 4:
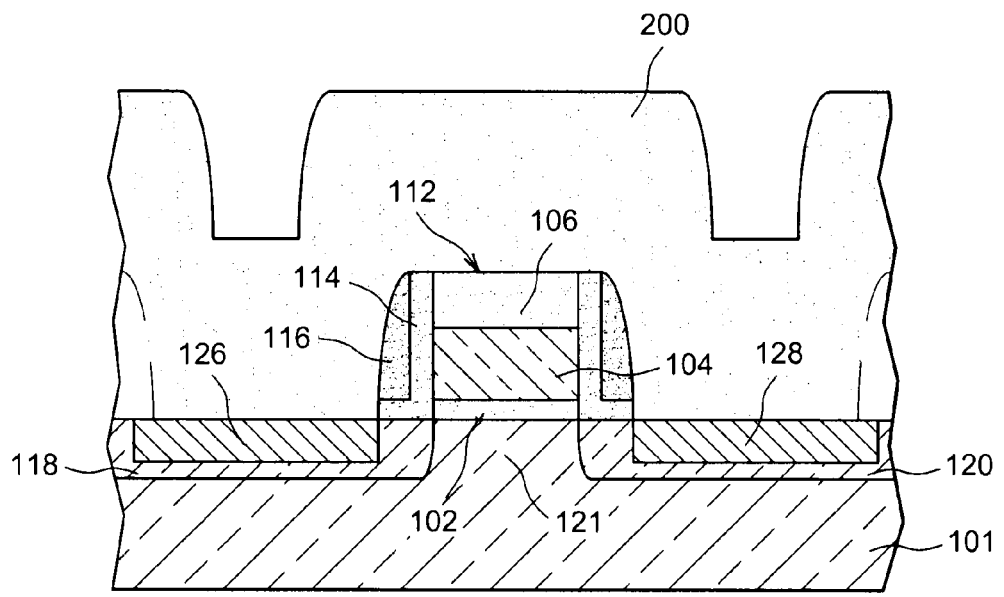

As represented in FIG. 4, the remaining portion of the layer of metal 124 is eliminated, then a coating is carried out by a layer 200 of the entire structure previously formed. This coating layer 200 here has a thickness greater than the height of the dummy gate 112, in other words the total thickness of the layers 102, 104 and 106. The material of the coating layer 200 is based on dielectric material, for example silicon oxide, or instead based on an electrically conductive material if it is desired that portions of said coating layer 200 found in contact with the source and drain regions form electrical interconnections of these regions.

Figure 5:
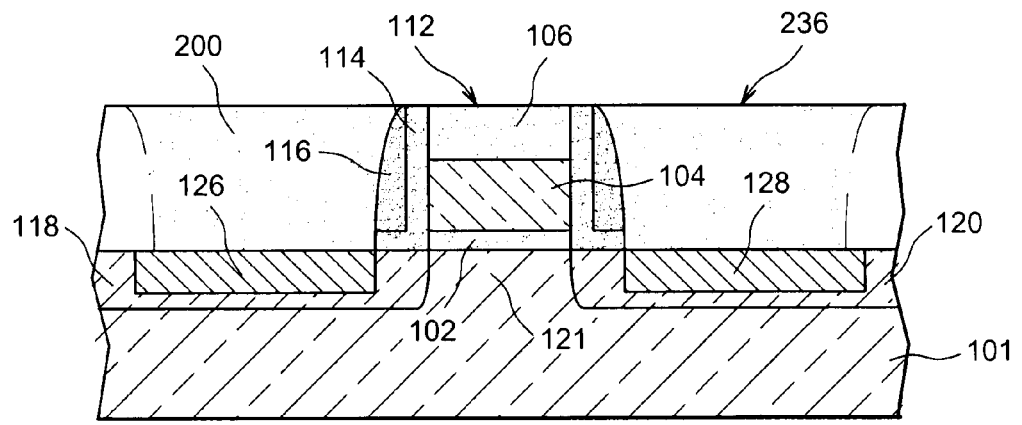

A planarisation of the coating layer 200 is then carried out with stoppage on the layer 106 of silicon nitride, imparting to the coating layer 200 a flat surface 236 (see FIG. 5). When the material of the coating layer 200 is electrically conductive, this planarisation makes it possible to electrically insulate from each other the source and drain regions.

Figure 6:
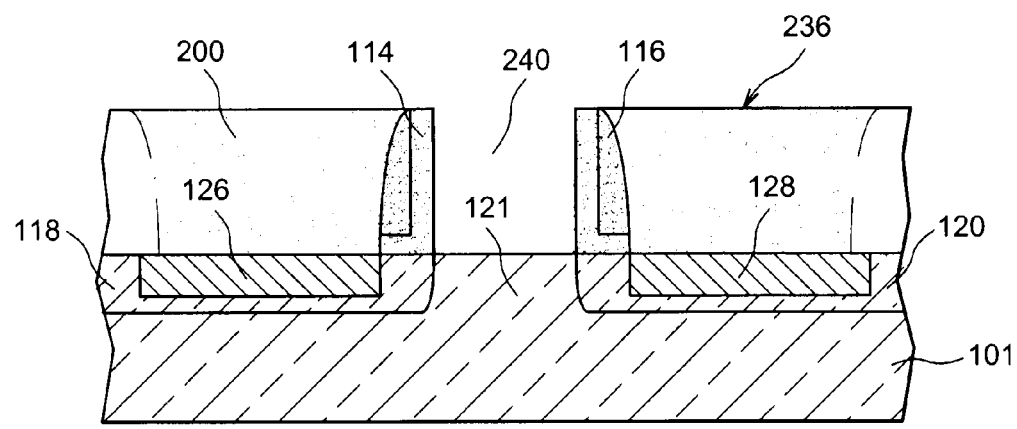

As represented in FIG. 6, the dummy gate 112 is then eliminated to form a hole 240 delimited by the first portions 114 of lateral spacers and surrounded by the coating layer 200. The elimination of the dummy gate 112 comprises for example the successive etching of the layers 102, 104 and 106 forming the dummy gate 112.

Figure 7:
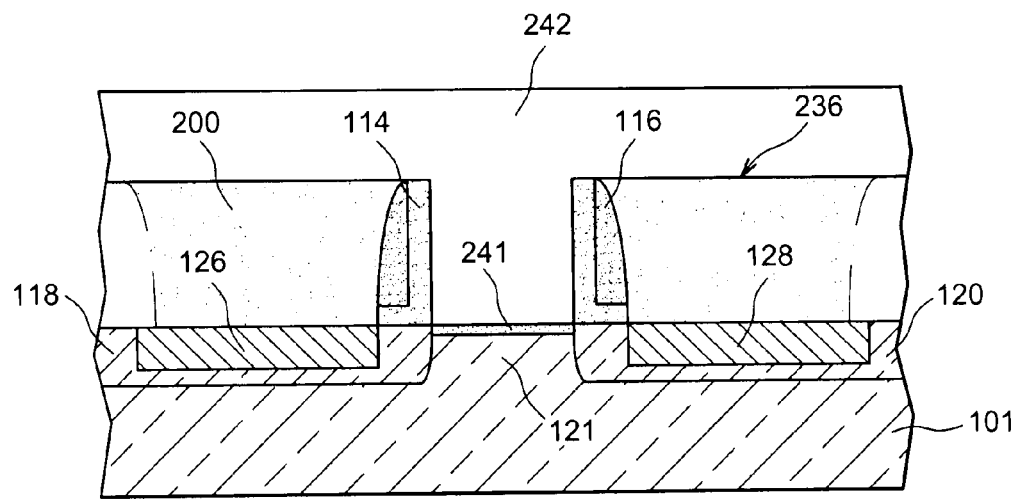

Then, at the level of the bottom wall of the hole 240, a first dielectric 241 is formed, based on a dielectric material such as for example silicon oxide obtained by oxidation of the part of the substrate 101 forming the bottom wall of the hole 240 (FIG. 7). This first dielectric 241 has for example a thickness less than or equal to around 10 nm. In an alternative embodiment, this first dielectric 241 could also be obtained by deposition of a layer of silicon oxide or any other appropriate dielectric material. In the case of a deposition, the first dielectric 241 may then cover the bottom wall of the hole 240, the other lateral walls of the hole 240 as well as the surface 236 and the lateral spacers. This first dielectric 241 makes it possible to electrically insulate the channel 121 from the future deposition of nanoparticles of the device 100 that will be formed on the first dielectric 241. In an alternative, the first dielectric 241 could also be based on $SiO_xN_y$, $HfO_2$, $HfZr_xO_y$ or instead $HfAl_xLa_yZr_zO_tN_u$. It is also possible that the first dielectric 241 is based on a dielectric having polar properties in order to facilitate a selective deposition of metal nanoparticles on this first dielectric 241.

An ionic liquid 242 in which metal nanoparticles have been synthesised is then spread out over the entire structure formed previously, for example by the implementation of a deposition by spin coating or by sputtering.

The nanoparticles are aggregates of several tens, hundreds or thousands of transition metal atoms (ruthenium, rhodium, palladium, etc.) having variable geometries and the dimensions of which are of the order of several nanometres, for example between around 0.5 nm and 10 nm. The presence of a high number of atoms on the surface of the nanoparticles confers them with magnetic, electronic and catalytic properties at the boundary between the molecular state and the bulk state.

The synthesis of the nanoparticles in an ionic liquid may be carried out by placing in solution an organometallic complex in a matrix ionic liquid under agitation at room temperature then by cooling the reactive medium to a temperature close to 0° C. The medium is pressurised under hydrogen for a time lasting between several hours and several days (depending on the complexes) until a suspension of metal nanoparticles is obtained.

Matrix ionic liquid is taken to mean an ionic liquid at room temperature capable of solubilising one or more chemical species such as mineral or organic salts, or organic or organometallic molecules. Said ionic liquid comprising the nanoparticles in suspension may be used pure or be mixed with one or more functionalised ionic liquids (for example an amine, an alcohol, a thiol or an ether) or not. The ionic liquid may also be mixed with another hydrophobic solvent.

Three examples are described below of carrying out the synthesis of metal nanoparticles in ionic liquids, the ionic liquids obtained, which comprise metal nanoparticles in suspension, may be used in the method for producing the memory device described herein.

Example of Synthesis of Ruthenium Nanoparticles in an Ionic Liquid of $BMIMNTf_2$ Type:

In a glove box, in other words a hermetically sealed box under controlled atmosphere (for example under argon atmosphere) in which the manipulations are performed with gloves, 10 ml of bis(trifluoromethanesulfonyl)imide 1-butyl-3-methyl imidazolium ($BMIMNTf_2$) is introduced into a glass autoclave. Ru(COD)(COT) (135 mg, 0.43 mmol, C=0.043 mol/L) is then dissolved completely therein, at room temperature and under vigorous agitation for 1 hour. When a homogeneous solution is obtained, the reactive medium is cooled to a temperature equal to around 0° C. and the agitation is stopped. The temperature of the medium is stabilised at around 0° C. The autoclave is then swept under a flow of hydrogen then pressurised under hydrogen to 4 bars for 72 hours. The medium is then evacuated under vacuum to eliminate the cyclooctane (COA) formed. A black colloidal suspension of ruthenium nanoparticles, each of which has a diameter equal to around 1.1 nm+/0.2 nm, dispersed in a uniform manner without any agglomeration and in which the size distribution is very narrow, is obtained.

The suspension of ruthenium nanoparticles obtained in the ionic liquid is stable several months when it is placed under argon atmosphere, at room temperature. In addition, even when carrying out a spin coating of the solution obtained or carrying out a precipitation by organic solvents (alkanes, dichloromethane, acetonitrile), no decantation of the ruthenium nanoparticles is observed in the ionic liquid.

Example of Synthesis of Ruthenium Nanoparticles in an Ionic Liquid of $HMIMNTf_2$ Type:

In a glove box, 10 ml of bis(trifluoromethanesulfonyl) imide 1-hexyl-3-methyl imidazolium ($HMIMNTf_2$) is introduced into a glass autoclave. Ru(COD)(COT) (135 mg, 0.43 mmol, C=0.043 mol/L) is then dissolved completely therein, at room temperature and under vigorous agitation for 1 hour. When a homogeneous solution is obtained, the reactive medium is cooled to a temperature equal to around 0° C. and the agitation is stopped. The temperature of the medium is stabilised at around 0° C. The autoclave is then swept under a flow of hydrogen then pressurised under hydrogen to 4 bars for 72 hours. The medium is then evacuated under vacuum to eliminate the cyclooctane (COA) formed. A black colloidal suspension of ruthenium nanoparticles, each of which has a diameter equal to around 1.9 nm+/0.2 nm, dispersed in a uniform manner without any agglomeration and in which the size distribution is very narrow, is obtained.

Once again, the suspension of ruthenium nanoparticles obtained in the ionic liquid is very stable several months when it is placed under argon atmosphere, at room temperature. In addition, even by carrying out a spin coating of the solution obtained or carrying out a precipitation by organic solvents (alkanes, dichloromethane, acetonitrile), no decantation of the ruthenium nanoparticles is observed in the ionic liquid.

Example of Synthesis of Ruthenium Nanoparticles in an Ionic Liquid of OMIMNTf$_2$ Type:

In a glove box, 10 ml of bis(trifluoromethanesulfonyl) imide 1-octyl-3-methyl imidazolium (OMIMNTf$_2$) is introduced into a glass autoclave. Ru(COD)(COT) (135 mg, 0.43 mmol, C=0.043 mol/L) is then dissolved completely therein, at room temperature and under vigorous agitation for 1 hour. When a homogeneous solution is obtained, the reactive medium is cooled to a temperature equal to around 0° C. and the agitation is stopped. The temperature of the medium is stabilised at around 0° C. The autoclave is then swept under a flow of hydrogen then pressurised under hydrogen to 4 bars for 72 hours. The medium is then evacuated under vacuum to eliminate the cyclooctane (COA) formed. A black colloidal suspension of ruthenium nanoparticles, each of which has a size equal to around 1.9 nm+/0.2 nm, dispersed in a uniform manner without any agglomeration and in which the size distribution is very narrow, is obtained.

Once again, the suspension of ruthenium nanoparticles obtained in the ionic liquid is very stable several months when it is placed under argon atmosphere, at room temperature. In addition, even by carrying out a spin coating of the solution obtained or carrying out a precipitation by organic solvents (alkanes, dichloromethane, acetonitrile), no decantation of the ruthenium nanoparticles is observed in the ionic liquid.

Ionic liquids, and their methods of manufacture, described in the document "Room Temperature Ionic Liquids, Solvents for Synthesis and Catalysis" of Thomas Welton, Chem. Rev, 1999, vol. 99, n°8, pages 2071-2084, may also be used for the implementation of the method for producing the memory device described here.

After having spread out over the entire structure the ionic liquid 242 in which metal nanoparticles have been synthesised, the assembly is left to incubate, for example at room temperature and for a time lasting between around 1 minute and 1 hour, in order to form a deposition of nanoparticles 244 located initially in the ionic liquid 242 against the walls of the hole 240 as well as on the spacers 114, 116 and on the upper face 236 of the coating material 200. These nanoparticles 244 are for example each composed of a hundred or so atoms. In the example described here, the nanoparticles 244 each have a diameter substantially equal to around 2 nm and are spaced apart by a distance substantially equivalent to their diameter, in other words around 2 nm. The density of the nanoparticles 244 obtained is thus for example equal to around $5.10^{13}$ cm$^{-2}$.

The incubation time is chosen as a function of the requisite density of nanoparticles: the longer said incubation time, the higher will be the density of deposited nanoparticles 244. Generally speaking, the density of deposited nanoparticles 244 depends on the kinetic of adsorption of the nanoparticles of the ionic liquid 242 on the surface with which the ionic liquid 242 is in contact. Thus, besides the incubation time, the quantity of nanoparticles 244 deposited on a surface is dependent on the affinity constant between the nanoparticles and this surface, said affinity constant being equal to the ratio of the kinetic association constant over the kinetic dissociation constant of the adsorption reaction, the initial concentration of nanoparticles in the ionic liquid 242, the density of reactional sites on the surface on which it is sought to form the deposit, or instead the diffusion coefficient of nanoparticles in the given medium.

The surplus of ionic liquid is then removed, for example by rinsing with 95% ethanol followed by drying with argon, in order to only conserve the deposition of nanoparticles 244 and eliminate the solvent residues. It is also possible to remove the excess of ionic liquid by carrying out a degradation by a heat treatment at a temperature between around 200° C. and 500° C.

A layer 246 based on dielectric of high permittivity (high-K), in other words the permittivity of which is greater than around 3.9, is then formed on the nanoparticles 244. This dielectric with high permittivity is for example Al$_2$O$_3$, TiO$_2$, HfO$_2$ or Ba$_x$Sr$_{1-x}$TiO$_3$ (BST). Said dielectric material may for example be chosen such that it has a dielectric constant greater than that of the material of the first dielectric 241. In an alternative, this dielectric layer 246 could be replaced by a stack of dielectric sub-layers, for example a stack of oxide/nitride/oxide type. The total thickness of the deposition of nanoparticles 244 and the dielectric layer 246 is here less than the depth of the hole 240, in other words less than the height of the dummy gate previously eliminated. A conductive material 248, intended to form subsequently the control gate of the device 100, is deposited over the entire structure, filling particularly the part of the hole 240 still not occupied by the nanoparticles 244 and the dielectric layer 246 deposited beforehand (see FIG. 8A). This conductive material is for example chosen among the following materials: polysilicon, W, TaN, W/TiN, Ti, Cu/TaN, W/Nb, W/RuO$_2$. It is also possible that the conductive material 248 is formed of a stack of several sub-layers based on such materials or any other material suited to the formation of the control gate.

Figure 8A:
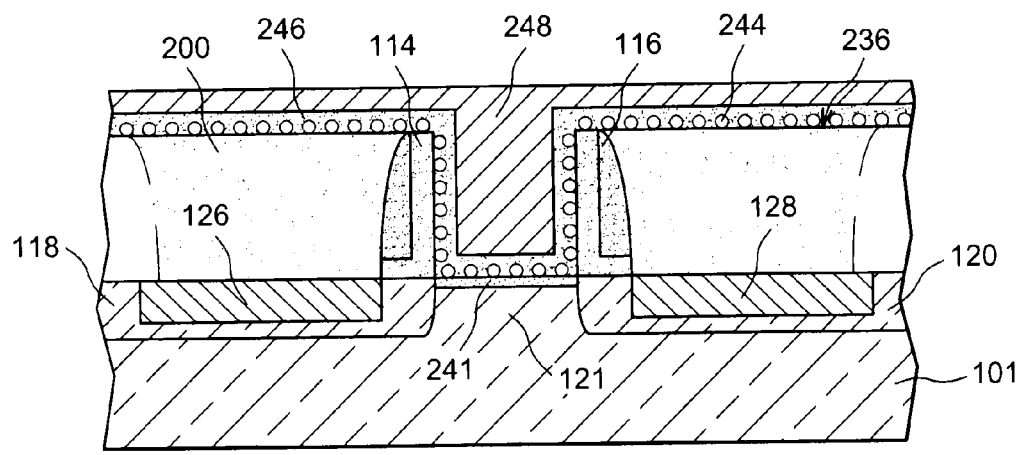
Figure 8B:
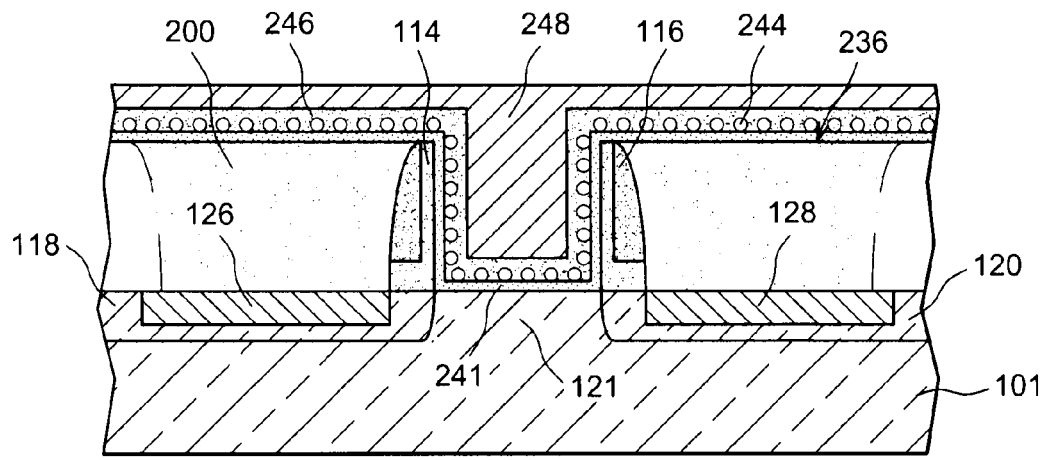

In an alternative, FIG. 8B represents the structure obtained when the first dielectric 241 is formed of a deposit covering the bottom wall of the hole 240, the other lateral walls of the hole 240, the surface 236 and the lateral spacers.

Figure 9:
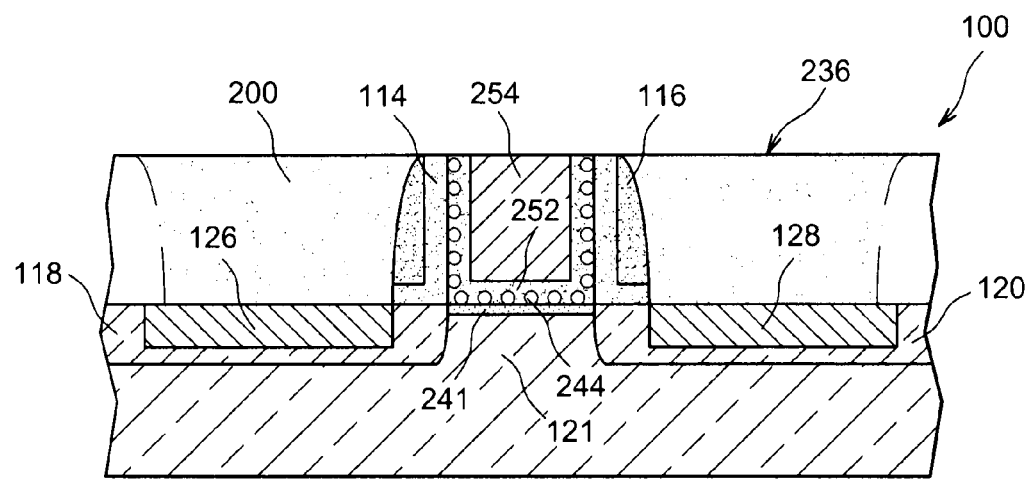

As represented in FIG. 9, a polishing is carried out of the layers 246 and 248 and the deposition of nanoparticles 244 formed previously with stoppage on the surface 236 of the coating material 200. The memory device 100 thereby obtained thus comprises a deposition of nanoparticles 244 formed above the first dielectric 241, as well as an electrically conductive portion 254 forming the control gate of the memory device 100 and formed of the remaining portion of the conductive material 248. In addition, a second dielectric 252 is formed of the remaining portion of the layer 246 and electrically insulates the control gate 254 from the deposition of nanoparticles 244.

It is then possible to implement steps of forming interconnections electrically connecting the source, the drain and the control gate to elements exterior to the memory device 100.

FIG. 9, which corresponds to a sectional plan of the device 100 passing through the source and the drain, shows the U shape, in the sectional plane represented in FIG. 9, of the assembly formed of the deposition of nanoparticles 244 and the second dielectric 252. The nanoparticles 244 are separated and insulated from the control gate 254 by the second dielectric 252. The nanoparticles 244 thus surround the control gate 254 on three sides, in other words here that located on the channel 121 side and the two lateral sides perpendicular to the substrate 101.

In the case where the first dielectric 241 is obtained by a deposition of dielectric, the polishing may be carried out with stoppage on the surface 236, as in the example represented in FIG. 9, or with stoppage on the surface of the dielectric layer 241 located on the surface 236.

In an alternative of the method described previously, it is possible to carry out, prior to the spreading of the ionic liquid 242 comprising the metal nanoparticles, a functionalisation of the surface against which the deposition of nanoparticles is intended to be formed. Such a functionalisation makes it possible to introduce a terminal group on the substrate that can interact with the metal particles, which can modify the adsorption reaction kinetic of the particles, their surface density and their stability on the surface during a step of rinsing of the substrate. This functionalisation may be carried out for example by silanisation or electrografting of diazonium salts (in this case, the thickness of the dielectric layer is preferably less than around 10 nm). The terminal groups may be for example chosen among thiol, carboxylate, carboxylic acid, amine, ammonium, thioester, thiourea, etc.

In an alternative of the first embodiment of the previously described method, it is possible, after spreading the ionic liquid 242, to polarise the rear face of the substrate 101 vis-à-vis the ionic liquid 242, in order to carry out a selective deposition of the nanoparticles 244 on the first dielectric 241, the thickness of which may be less than those of the lateral spacers 114, 116. This alternative may apply when the first dielectric 241 is obtained by oxidation of the substrate 101 or when the first dielectric 241 is obtained by deposition. By applying a difference of potentials between the substrate 101 and the ionic liquid 242, a more intense electric field is present at the level of the first dielectric 241 than at the level of the lateral spacers 114, 116 because the first dielectric 241 has a thickness less than that of the lateral spacers. This electric field difference makes it possible to increase the rate of deposition of nanoparticles on the first dielectric 241 compared to that at the level of the lateral spacers 114, 116, and thus favours the deposition of nanoparticles contained in the ionic liquid 242 on the first dielectric 241. A quasi-selective deposition of nanoparticles 244 is thus carried out on the first dielectric 241. Unlike the memory device 100 represented in FIG. 9, the memory device having undergone such a polarisation of the substrate thus does not comprise nanoparticles deposited against the lateral walls of the spacers 114, 116, the nanoparticles being uniquely deposited at the bottom of the hole obtained by the removal of the dummy gate, against the first dielectric 241. In this alternative embodiment, the first dielectric 241 can in particular be based on a material having polar properties in order to facilitate the formation of nanoparticles against the first dielectric 241.

Figure 10:
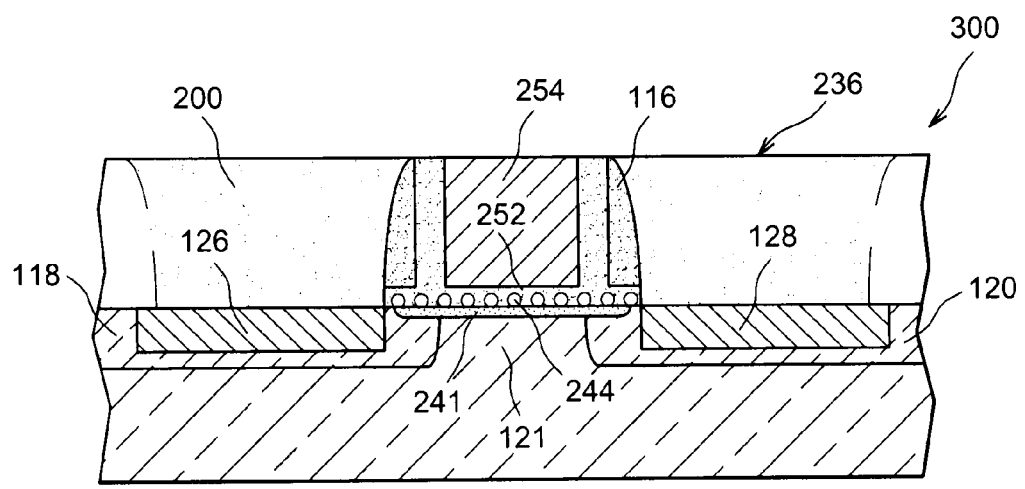
FIGS. 10 and 11 represent a nanoparticle memory device obtained by the implementation of a method for producing a nanoparticle memory device according to a second embodiment.

The production of a memory device 300, represented in FIG. 10, obtained by the implementation of the method for producing memory devices according to a second embodiment, will now be described.

Firstly, the previously described steps of the method according to the first embodiment with reference to FIGS. 1 to 6 are implemented.

An etching of the first portions of silicon oxide 114 of the lateral spacers is then carried out. The material of the first portions 114 is in particular chosen so as to be able to etch them selectively compared to the second portions 116 of the lateral spacers. In this way are formed, underneath the second portions 116, hollows in which nanoparticles are intended to be formed. Then the first dielectric 241 is formed in an analogous manner to the first embodiment, in other words either by oxidation (case of FIG. 10), or by deposition in the hole 240, the first dielectric 241 being in this case also deposited against the walls located in the hollows formed underneath the second portions 116 of the lateral spacers.

The ionic liquid 242 in which metal nanoparticles have been synthesised is then spread over the entire structure formed previously, for example by the implementation of a deposition by spin coating or by sputtering. Compared to the first embodiment, the ionic liquid also spreads in the hollows formed previously underneath the second portions 116 of the lateral spacers.

Figure 11:
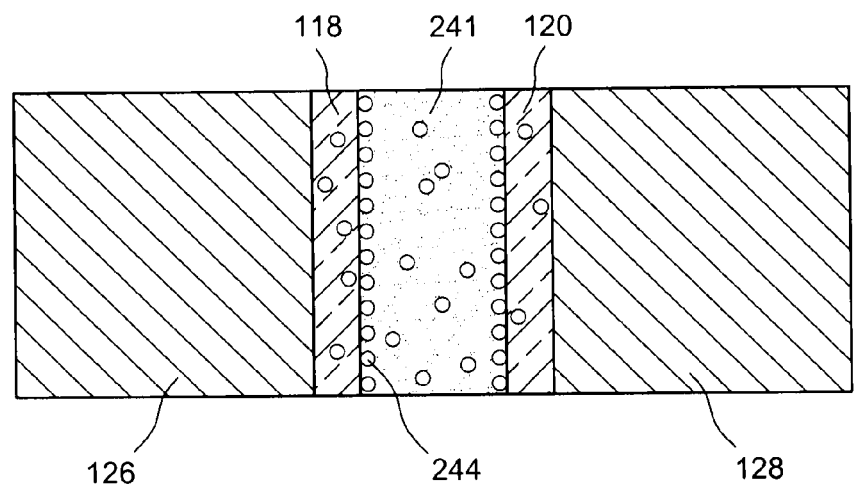

The incubation of the assembly is then carried out in order to form a deposition of nanoparticles against the first dielectric 241, but also in the hollows, underneath the second portions 116 of the lateral spacers. In addition, during the incubation, a difference of electric potentials is applied between the ionic liquid 242 and the source and drain regions 118, 120. By carrying out such a polarisation, the formation of nanoparticles underneath the second portions 116 of the lateral spacers is favoured. The nanoparticles 244 deposited are thus mainly concentrated at the level of the junction between the channel 121 and the source and drain regions 118, 120. FIG. 11 represents a schematic view of the deposition of nanoparticles 244 obtained on the substrate 101 with this second embodiment. In this FIG. 11, it may be seen that the nanoparticles 244 are mainly deposited at the junction between the first dielectric 241 and the source and drain regions 118, 120. The second dielectric 252 and the control gate 254 are then formed in an analogous manner to the first embodiment.

This production method according to the second embodiment thus makes it possible to optimise the architectures of memory devices employing programming by hot electrons. In this way, the deposition of nanoparticles above source and drain regions having a work function distinct from that of the channel is favoured.

This second embodiment makes it possible to well control the injection of charge carriers in the "pseudo floating gates", formed of the nanoparticles 244, located directly above the source and drain regions 118, 120, underneath the lateral spacers. In this way, the dispersions of characteristics of the memory devices formed are even better controlled. This method according to the second embodiment is thus particularly suited for the production of multi-level memory devices for example described in the document WO 98/03977, given that the lay out of nanoparticles 244 on one side or the other of the channel makes it possible to double the storage capacity of the memory devices thereby formed, the information can be stored in the nanoparticles located on the source side or in the nanoparticles located on the drain side.

In an alternative of this second embodiment, it is possible to concentrate the nanoparticles deposited only on one side of the channel, in other words either on the source side or on the drain side, while only polarising one of these two regions in relation to the ionic liquid. The deposition of nanoparticles obtained is thus no longer symmetric in relation to the channel, unlike the deposits of nanoparticles of the memory devices described previously.

Figure 12:
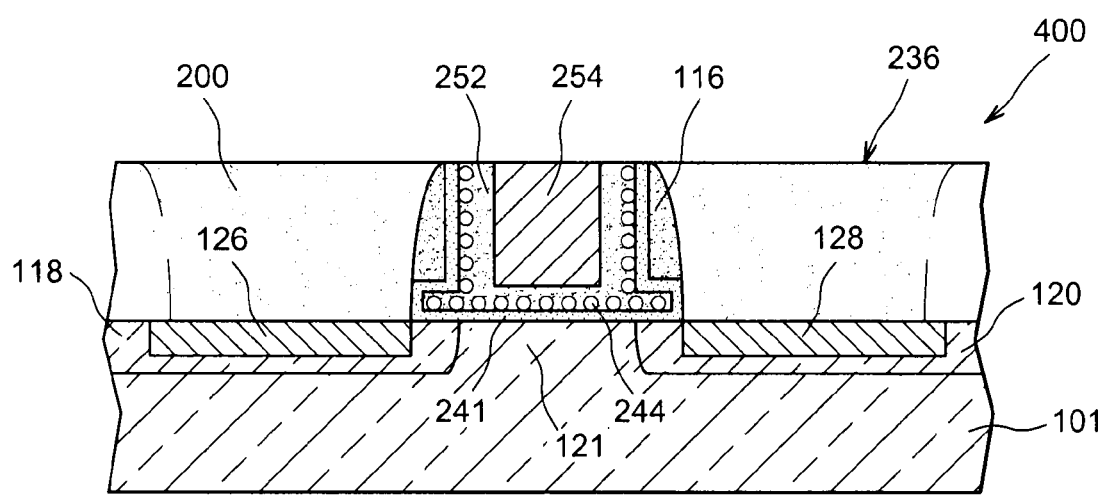
FIG. 12 represents a nanoparticle memory device obtained by the implementation of a method for producing a nanoparticle memory device according to a third embodiment.

FIG. 12 represents a memory device 400 obtained by the implementation of a method for producing memory devices according to a third embodiment.

In this third embodiment, the steps described previously with reference to FIGS. 1 to 6 are implemented.

After having carried out an etching of the first portions 114 of the lateral spacers, the first dielectric 241 is obtained by deposition on all of the walls of the hole 240, including in the hollows located underneath the second portions 116 of the spacers.

The device 400 is then completed in an analogous manner to the first embodiment, in other words by spreading over the entire structure formed previously, for example by the implementation of a deposition by spin coating or by sputtering, the ionic liquid 242 in which metal nanoparticles have been synthesised. The ionic liquid also spreads in the hollows formed previously underneath the second portions 116 of the lateral spacers, against the first dielectric 241.

The incubation of the assembly is then carried out so as to form a deposition of nanoparticles against the first dielectric 241. The second dielectric 252 and the control gate 254 are then formed in an analogous manner to the first embodiment.

The invention claimed is:

1. A method for producing a memory device with nanoparticles, comprising at least the steps of:
    a) forming, in a substrate based on at least one semiconductor, source and drain regions, and at least one first dielectric on at least one zone of the substrate arranged between the source and drain regions, said at least one zone intended to form a channel of the memory device, wherein the forming of the source and drain regions is obtained by steps including,
        a1) forming at least one dummy gate on the substrate, at said at least one zone intended to form the channel of the memory device,
        a2) implanting dopants in the substrate using the dummy gate as an implantation mask, wherein doped zones of the substrate obtained from the implanting form the source and drain regions,
        a3) forming spacers based on at least one dielectric material against lateral flanks of the dummy gate,
        a4) depositing at least one coating layer on the dummy gate, the spacers and the source and drain regions,
        a5) planarizing the coating layer with stoppage on the dummy gate,
        a6) removing the dummy gate,
        a7) etching at least one part of the spacers in contact with the substrate, and
        a8) forming hollows underneath a remaining part of the spacers,
    b) depositing of at least one ionic liquid that is an organic salt or mixture of organic salts in a liquid state, wherein nanoparticles of at least one electrically conductive material are suspended in the ionic liquid, said ionic liquid covering at least said first dielectric and being deposited in said hollows,
    c) forming, after step b), a deposition of said nanoparticles at least on said first dielectric and at zones of the substrate situated in said hollows,
    d) removing, after step c) the ionic liquid remaining on the first dielectric, and
    e) forming, after step d), at least one second dielectric and at least one control gate on at least one part of the nanoparticles deposited on the first dielectric.

2. The method according to claim 1, further comprising, between the step of forming spacers and the step of depositing the coating layer, a step of silicidating at least one part of the source and drain regions.

3. The method according to claim 1, wherein the step c) of forming the deposition of nanoparticles comprises at least one step of incubating the substrate and the ionic liquid for a time lasting between five minutes and one hour.

4. The method according to claim 1, further comprising applying a non-zero difference of electric potentials between the substrate and the ionic liquid during at least one part of step c) of the forming the deposition of nanoparticles.

5. The method according to claim 4, wherein the difference of electric potentials is applied, via the substrate, between at least one of the source and drain region and the ionic liquid.

6. The method according to claim 1, wherein the step d) of removing the ionic liquid comprises a step of rinsing by a solvent and a step of drying, or a step of degradation by a heat treatment at a temperature between 200° C. and 500° C.

7. The method according to claim 1, wherein the step e) of forming the second dielectric and the control gate is obtained by steps comprising:
    e1) depositing a layer based on a dielectric material at least on the nanoparticles deposited in step b),
    e2) depositing a layer based on an electrically conductive material on the layer based on dielectric material, and
    e3) planarizing at least said layer based on electrically conductive material and said layer based on dielectric material.

8. The method according to claim 1, wherein the ionic liquid comprises at least one cation of alkyl substituent bearing imidazolium.

9. The method according to claim 1, wherein the ionic liquid is chosen among $BMIMNTf_2$, $HMIMNTf_2$ or $OMIMNTf_2$, the nanoparticles in suspension in the ionic liquid are based on ruthenium.

10. The method according to claim 1, wherein the step b) includes depositing the ionic liquid by spin coating or by spraying.

11. The method according to claim 1, wherein the nanoparticles in suspension in the ionic liquid are ruthenium.

* * * * *